United States Patent [19]

Huss et al.

[11] Patent Number: 5,003,209
[45] Date of Patent: Mar. 26, 1991

[54] REDUCED LENGTH ROTATING RECTIFIER ASSEMBLY

[75] Inventors: John B. Huss; Bert J. Fennel, both of Rockford, Ill.

[73] Assignee: Sundstrand Corporation, Rockford, Ill.

[21] Appl. No.: 535,898

[22] Filed: Jun. 11, 1990

[51] Int. Cl.$^5$ ............................................. H02K 11/00
[52] U.S. Cl. .................................. 310/68 D; 357/76; 357/75
[58] Field of Search ............. 310/68 D; 363/141, 145, 363/144; 357/76, 75

[56] References Cited

U.S. PATENT DOCUMENTS

| | | | |
|---|---|---|---|
| 4,144,932 | 3/1979 | Voigt | 310/68 D |
| 4,603,344 | 1/1986 | Trommer | 310/68 D |
| 4,628,219 | 12/1986 | Troscinski | 363/141 |
| 4,745,315 | 5/1988 | Terry, Jr. et al. | 310/68 D |
| 4,797,590 | 1/1989 | Raad et al. | 310/68 D |
| 4,806,814 | 2/1989 | Nold | 310/68 D |
| 4,827,165 | 5/1989 | Nold | 310/68 D |

Primary Examiner—Steven L. Stephan
Assistant Examiner—Matthew Nguyen
Attorney, Agent, or Firm—Wood, Phillips, Mason Recktenwald & VanSanten

[57] ABSTRACT

The disclosed rotating rectifier assembly (12) has a reduced axial length thereby achieving the goal of reducing the overall axial length of a brushless generator (10) which includes a rectifier assembly disposed along its axis (26) for developing DC output power from three phase AC power supplied by a three phase rotor armature (14) also contained within the generator (10). A typical rotating rectifier assembly is comprised of plates and diodes arranged in a stack clamped axially along the axis of rotation with a diode sandwiched between each adjacent pair of plates. The reduction of the axial length of the rectifier (12) is achieved by positioning a stack (67) of diodes (19) and plates (52 through 64) perpendicular to the axis of rotation (26) while providing the necessary electrical conductors to define a rectifier circuit.

8 Claims, 5 Drawing Sheets

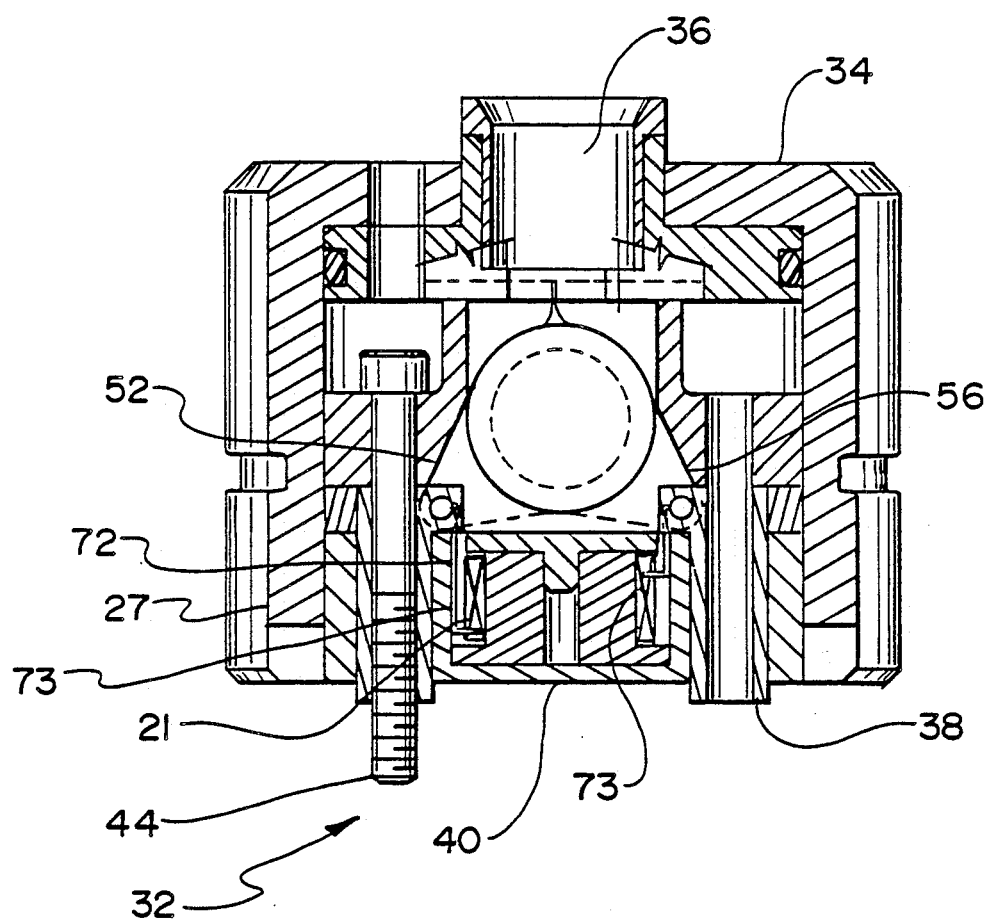

REDUCED LENGTH ROTATING RECTIFIER ASSEMBLY

FIELD OF THE INVENTION

This invention relates to a rectifier assembly that is adapted to be disposed in a rotor, as for example, a generator rotor and to be rotated at high speed therewith. More particularly, it relates to rectifier assemblies of the foregoing type wherein axial length is minimized.

BACKGROUND OF THE INVENTION

In many generators such as high speed generators utilized in aircraft, it is highly desirable to eliminate brushes since they frequently require maintenance and/or replacement and are perhaps the single weakest point in the system in terms of breakdowns. Moreover, by its very nature, the electrical path between a brush and a commutator is subject to arcing which may introduce transients into the electrical energy being produced which in turn may interfere with proper operation of some types of electrical loads on the generator.

A typical brushless generator has three distinct generating systems, including a main generator, an exciter and a permanent magnet generator. The permanent magnet generator includes rotatable permanent magnets for establishing a magnetic field which is electrically employed to induce current in a set of stationary windings which in turn is employed after rectification and voltage regulation to generate a magnetic field in the exciter. The magnetic field in the exciter is in turn employed to induce an even higher level of current, typically three phase alternating current, which is then employed after rectification to generate the magnetic field for the main generator by flowing a DC current through a main field winding of the generator system.

In order to avoid the use of brushes, it is necessary that the field winding in the main generator be in the rotor so that the output of the system can be taken from a stator of the main generator. In order to generate a suitable magnetic field in the rotor, it is necessary to utilize direct current as opposed to alternating current for the same. Since the output of the exciter is an alternating current, this current must be rectified by a rectifier assembly to direct current. Again in order to avoid resorting to brushes, it is necessary that the rectifier assembly interconnecting the exciter and the main generator field winding be carried by the rotor of the generator. Such a rectifier assembly should also be capable of withstanding high centrifugal loading. One such rectifier assembly is disclosed in commonly owned U.S. Pat. No. 4,628,219 issued Dec. 9, 1986, to Troscinski.

It is of course desirable in aircraft applications to minimize weight. In the case of brushless generators having a relatively long axial length, because such generators are typically mounted to the engine gear box at only one end of the generator, such generators result in the presence of a relatively large, so-called "overhung" moment. In order to support such a generator, the gear box must be made proportionately stronger than would be the case for a generator having a lesser overhung moment; and that reinforcement will most frequently require the presence of additional undesirable weight. In addition, aircraft applications require that close heed be paid to aerodynamic considerations. These considerations may dictate location of aircraft components in areas where space is at a premium or else an aerodynamic penalty may be felt.

One method of reducing the overall length of a two-pole brushless generator system is disclosed in commonly owned U.S. Pat. No. 4,797,590 issued Jan. 10, 1989 to Raad, et al. Raad disclosed a brushless generator wherein both the permanent magnet generator and the exciter are adjacent one end of the main generator in an essentially coplanar relation with the permanent magnet generator radially inward of the exciter. However, in a two pole brushless generator system where, as is well known in the art, a solid rotor is required, use of the arrangement disclosed in Raad is not feasible.

A way to reduce the overall axial length of a brushless generator system is to reduce the axial length of the rotating rectifier diode package. The package in use now has an axial length greater than three inches This application describes a design of a rectifier assembly which is 1.55 inches long, which presents a decrease in the length of the package.

It is also desirable to provide a way for easily removing a rectifier assembly in the event of a failure.

The present invention is directing to overcoming one or more of the above problems.

SUMMARY OF THE INVENTION

It is an object of this invention to provide an improved rotating rectifier assembly which has a reduced axial length.

An exemplary embodiment of the invention achieves the foregoing object in a brushless generator including a permanent magnet generator, an exciter and a main generator together with means coupling the components to define a brushless generator.

According to the invention, the rectifier assembly includes a general housing intended to be rotated around an axis, a plurality of diode wafers and electrically conductive plates arranged to form a stack wherein a diode is placed between each adjacent pair of plates, means for applying a compressive pressure to the stack to bring the plates and wafers into good thermal and electrical contact, and electrical conductors within the housing in electrical contact with predetermined ones of the plates and electrically isolated from predetermined others of the plates to define a rectified circuit.

The disclosed housing is can-life and includes an opening through which the stack may be introduced. A closure is provided for the opening and the compressive pressure applying means includes compressed spring means interposed between the closure and the two end most plates in the stack. It is a feature of the invention that the spring means comprises at least one wavy spring with a ring abutting the spring oppositely of the stack.

Another feature is that the invention includes an insulator perpendicular to the stack and which has a central annular ridge defining an additional recess facing the stack and a donut like resister is disposed in the additional recess.

Another feature of the invention is that there is one plate attached to each of the three phase leads by means of wire and two other plates attached to each of the two field leads by means of pins Other objects and advantages will become apparent from the following specification taken in connection with the accompanying drawings

DESCRIPTION OF THE DRAWINGS

FIG. 7 is a sectional view of the assembly taken along the 7—7 line of FIG. 5 showing the means by which the assembly may be connected to the main field winding of an electrical generator.

DETAILED DESCRIPTION OF THE INVENTION

Figure 1:
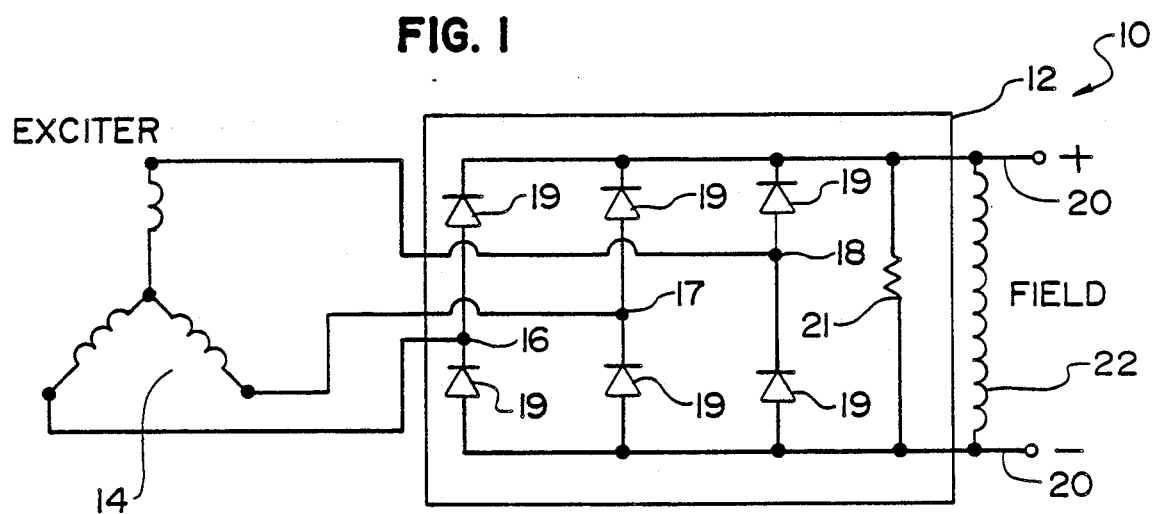
FIG. 1 is an electrical schematic of the rectifier assembly.

With reference to FIG. 1, a schematic diagram illustrates a portion of a brushless generator 10 including a rotating rectifier bridge assembly 12. The complete generator 10 (see FIG. 2), as discussed above, may include an exciter including a three phase rotor armature winding 14 which develops three phase AC power supplied to junctions 16, 17 and 18 of the rectifier assembly 12. The rectifier assembly 12 includes six diodes 19 connected in a bridge configuration to the junctions 16, 17 and 18 to develop DC output power at opposite rails 20. A resistor 21 is disposed across the rails 20. The DC power is provided to a DC rotor field winding 22 of a main generator (See FIG. 2).

Figure 2:
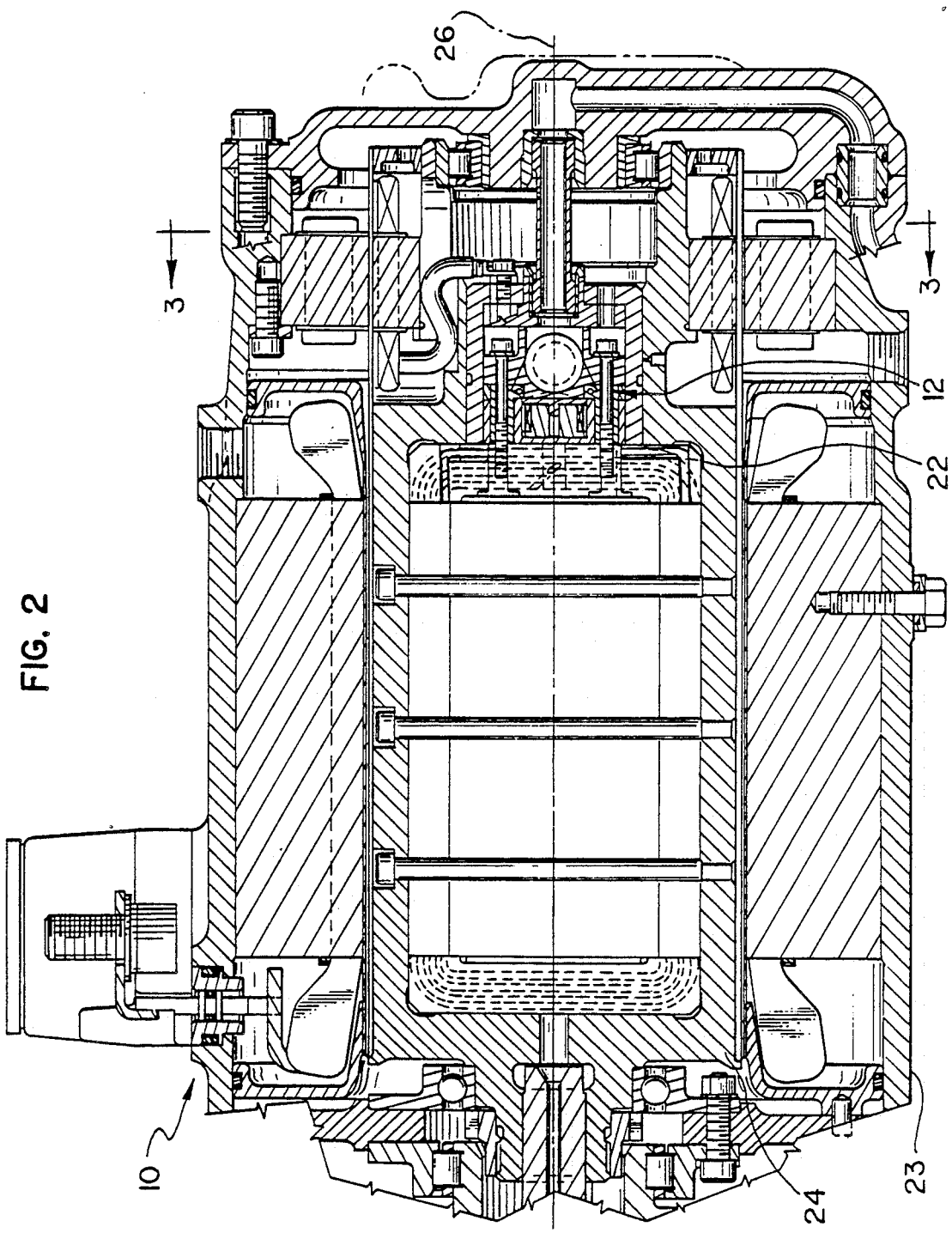
FIG. 2 is a sectional view of a typical two-pole brushless generator containing an exemplary embodiment of a reduced length rotating rectifier assembly made according to the invention.

With reference to FIG. 2, the rotating rectifier assembly 12 is disposed in a typical two-pole brushless generator housing 23. The generator 10 has a rotor 24 disposed within the housing 23 and rotational about an axis, represented by line 26.

Each of the windings 14 and 22 and rectifier assembly 12 are mounted in the rotor 24. The polyphase voltage developed in the exciter armature winding 14, caused by rotation of the rotor 24, is rectified by the rectifier assembly 12 to power the main field winding 22 which is used to develop AC output power, as is well known.

Figure 4:
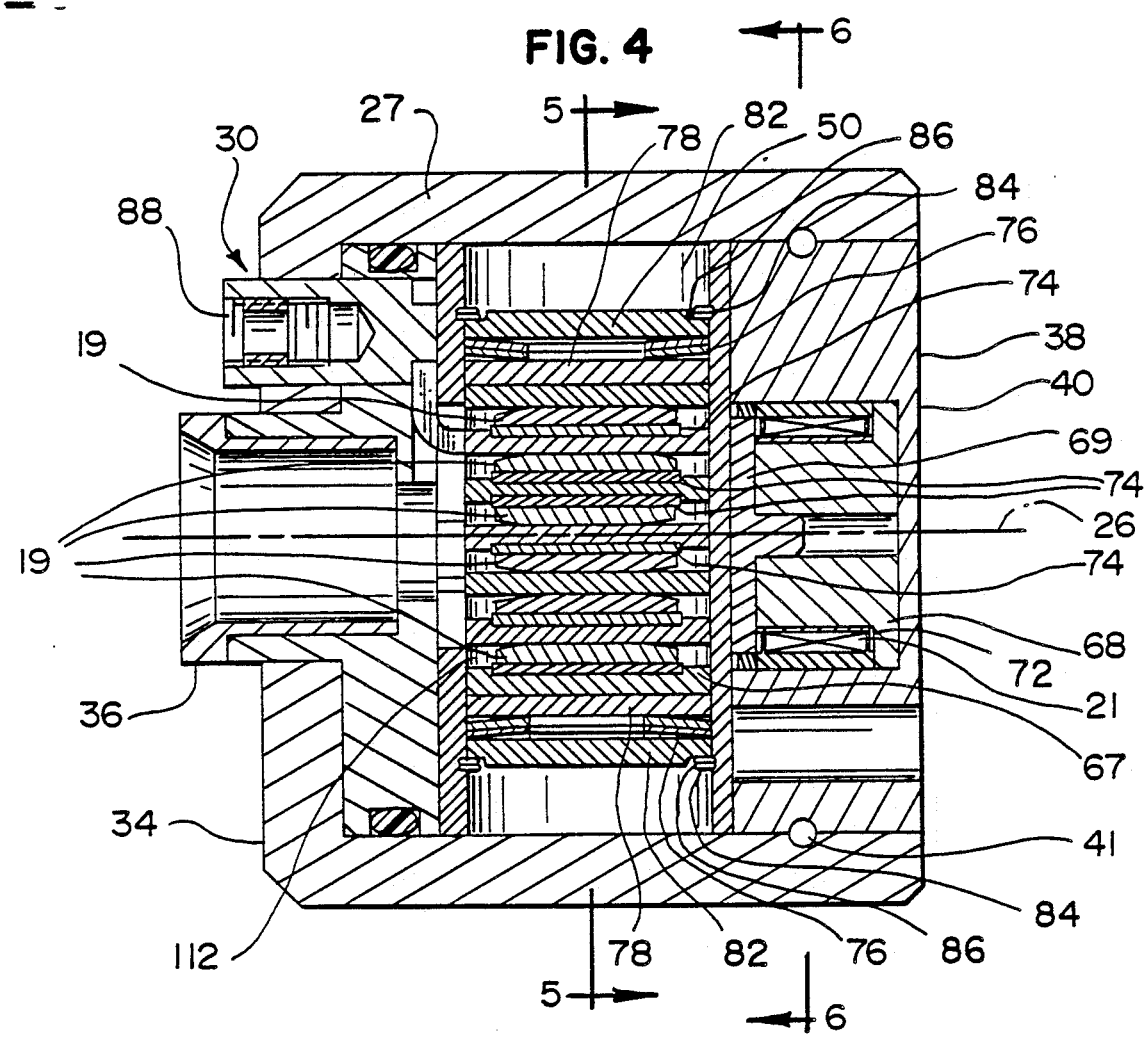
FIG. 4 is a sectional view taken along the line 4—4 of FIG. 3 showing a typical connector whereby the assembly may be electrically connected to one phase output of an exciter.

The assembly 12 as illustrated in FIGS. 4 and 7 is seen to include a can-like housing 27. The housing 27 includes input terminals 30 extending axially from the housing at one end and output terminals 32 extending axially from the housing at an opposite end, see FIG. 7. The input terminals 30 are used for connecting the assembly 12 to the respective phases of an AC power source, such as the winding 14, see FIG. 1. Similarly the output terminals 32 are used for electrically connecting the rectifier assembly 12 to a point of use, such as the DC field winding 22, see FIG. 1.

The housing 27 includes a closed end 34 through which the input terminals 30 extend. The closed end 34 includes a central port 36 for connection to a coolant supply (not shown). Axially opposite the closed end is an axial open end 38 having a removable closure 40, sealed at 41, used for inserting the rectifier assembly therethrough.

The rectifier assembly housing 27 has an interior cavity 50 which serves to house rectifier components Within the interior 50, centered around the axis of rotation 26, parallel to the axis 26, are seven relatively thin plates 52, 54, 56, 58, 60, 62 and 64 which are formed of a material that is a good thermal and electrical conductor. The plates 52 through 64 are aligned with each other to form a stack and the plates 52 through 64 sandwich a total of six diode wafers 19, one wafer 19 between each pair of adjacent plates, forming a stack 67 of diodes and plates. The arrangement of the stack 67 perpendicular to the axis 26 results in a reduction of the axial length of the rectifier assembly over assemblies having a stack of diodes and wafers clamped axially along the axis of rotation. The axial length of a rectifier assembly is decreased by this configuration because the length of a plate is less than the length of a stack of diodes and wafers disposed axially in typical assemblies.

A plate 68 and an insulator 69 support a donut-like resistor 21 axially perpendicular to the stack 67. Centrally of the plate 68 and the side thereof facing the stack 67 is a radially projecting annular ridge 72 which defines a recess for receipt of the resistor 21. The resistor 21 is connected to the stack 67 by two wires 73, see FIG. 7.

Figure 5:
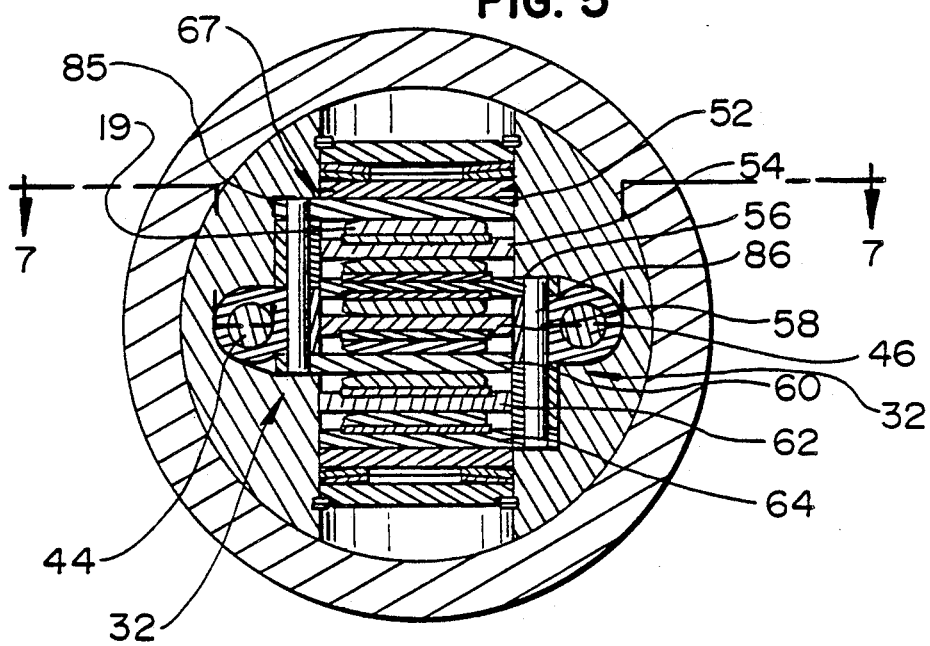
FIG. 5 is a sectional view of the assembly taken along the 5—5 line of FIG. 4 showing the connection of the field leads to the plates.
Figure 6:
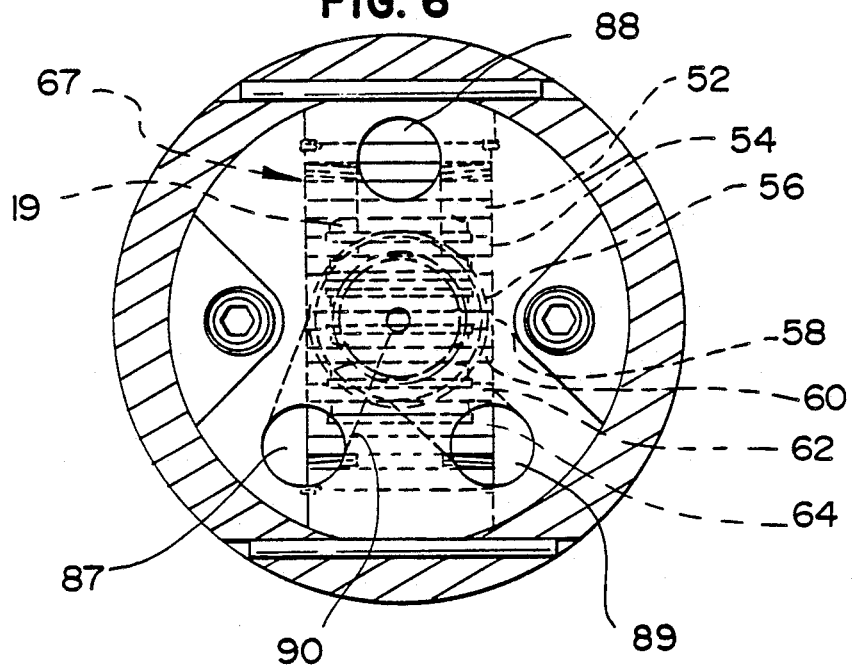
FIG. 6 is a sectional view of the assembly taken along the 6—6 line of FIG. 4 showing the connections between the phase leads and the plates.

As illustrated in FIGS. 4, 5, and 6, the top side of the plate 54 is provided with a relatively shallow annular recess defined by ridge 74 in which a diode 19 is received. The top side of each plate 62 and 64 is similarly provided with relatively shallow recesses defined by ridges 74 in which a diode 19 is received. The bottom side of plate 58 has a relatively shallow recess defined by ridge 74 in which a diode 19 is received Both, the top and bottom sides of plate 56 have relatively shallow recesses defined by ridges 74 in which a diode 19 is received.

To assure that the electrodes of the diode wafers 19 are in good electrical contact with the plates 52 through 64, a series of annular wavy springs 76 are compressed against the spacers 78 by rings 82 just radially outwardly of the top and bottom of the stack 67 and inwardly of the casing 27. Each ring 82 is held in place radially by lock rings 84 received in an axially inwardly opening groove 86 on the interior 50 at an upper and lower end of the housing 27. In this respect, force supplied by the wavy spring assembly 76 is uniformly applied to the stack 67.

Referring to FIGS. 5 and 7, tear shaped plates 52 and 60 are connected by a pin 85 to a first field lead 44. Tear-shaped plates 56 and 64 are connected by a pin 86 to a second field 46. Field leads 44 and 46 are connected to the output terminals 32, and correspond to the rails 20 in FIG. 1.

Figure 3:
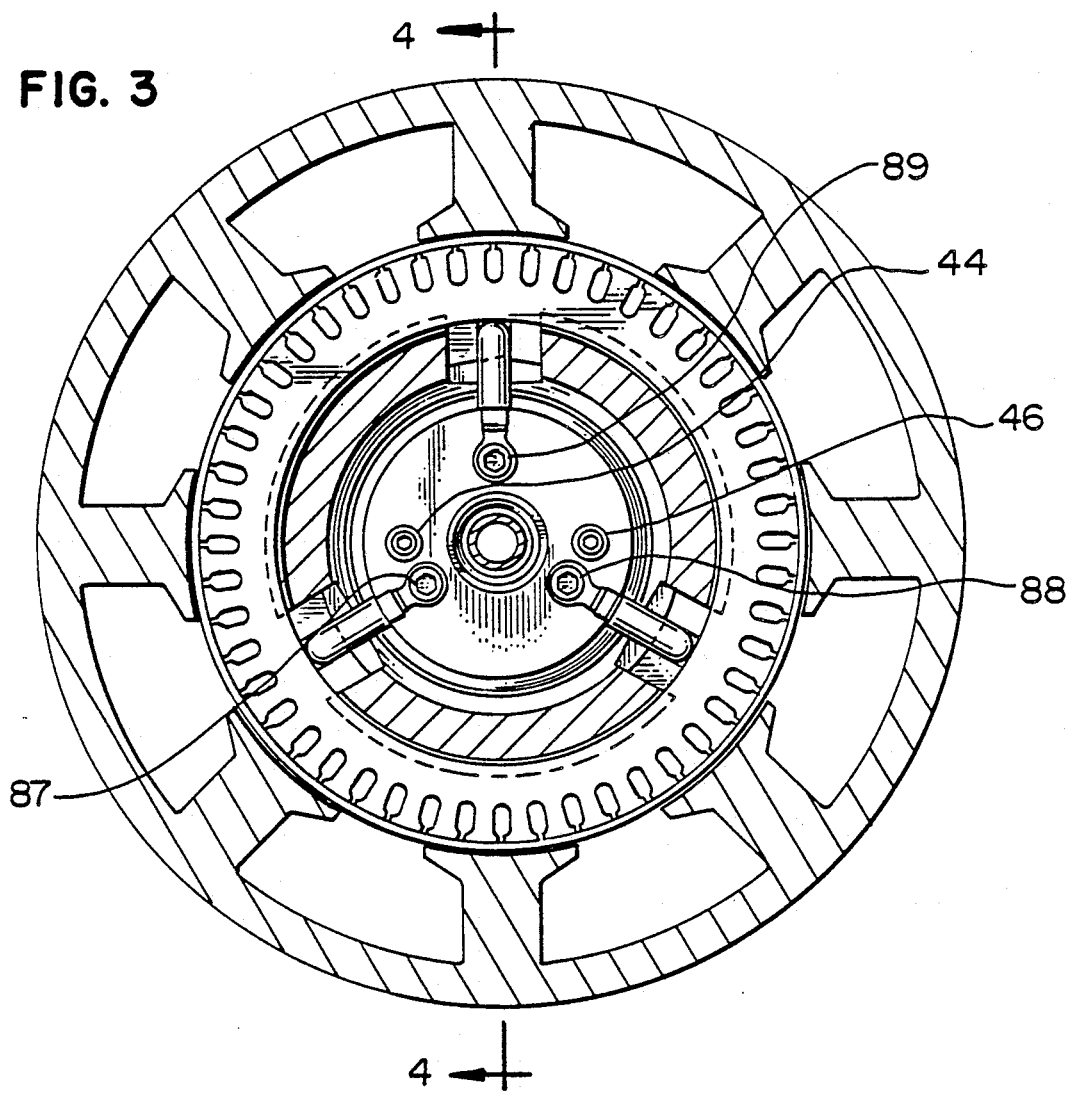
FIG. 3 is an end view of the assembly taken along the 3—3 line of FIG. 2 showing the locations of the phase leads and field leads.

Referring to FIG. 6, plates 54, 58, and 62, corresponding to junctions 16, 17 and 18 of the schematic diagram in FIG. 1, are each electrically connected with one of the respective three phase leads 87, 88, 89 by means of a wire 90 while electrically isolated from other of the phase leads. As illustrated in FIG. 3, the phase leads 87, 88 and 89 are positioned at 120 degree angles from each other.

The plates 52 and 64 may be provided with a series of apertures or openings 112 between the plates which serve to define fluid passages for coolant entering the housing 27 to allow the same to circulate through and between the various plates.

During the operation of the machine in which the rectifier is utilized, this configuration results in smooth introduction of a coolant into the housing 27 thereby minimizing the pressure drop of coolant flow through the housing to reduce energy requirements in pumping the coolant.

From the foregoing, it will be appreciated that a rotating rectifier assembly made according to the invention is ideally suited for use in two-pole generators in high speed dynamo electric machines. The semi-conductors employed are maintained along the rotational axis to minimize stress applied thereto and the assembly incorporates an excellent coolant means allowing rectifier capacity to be increased to a maximum. The assembly may be easily disassembled for servicing by means of the removable closure.

We claim:

1. A rotating rectifier assembly comprising:
   a housing intended to be rotated around an axis;
   a stack comprising a plurality of diode wafers placed perpendicular to the axis and a plurality of electrically conductive stacked plates wherein each diode is sandwiched between each adjacent pair of said plates;
   means for applying a compressive pressure to said stack to maintain said plates and wafers in electrical contact; and
   electrical conductors within said housing and in electrical contact with predetermined ones of said plates and electrically isolated from predetermined others of said plates to define a rectifier circuit.

2. The rectifier assembly of claim 1 wherein at least one face of select ones of said plates includes a radially directed relatively shallow annular ridge centrally of the face and defining a relatively shallow recess for receiving a diode.

3. The rectifier assembly of claim 1 wherein said housing is can-like and includes an opening through which said stack may be introduced; and a closure for said opening.

4. The rectifier assembly of claim 1 wherein said pressure applying means comprises compressed springs interposed between said housing and end-most ones of said elements in said stack.

5. The rectifier assembly of claim 4 wherein said spring means comprises at least one wavy spring, a ring abutting said spring oppositely of said stack and a lock ring received in an interior groove n said housing.

6. The rectifier assembly of claim 1 further including an additional plate perpendicular to said stack and having a central annular ridge defining an additional recess facing said stack; and a donut-like resistor in said additional recess and in electrical contact with said additional plate.

7. The rectifier assembly of claim 1 further comprising a means for flowing coolant through said housing and about said plates.

8. A rotating rectifier assembly comprising:
   a housing intended to be rotated around an axis;
   a stack comprising a plurality of diode wafers placed perpendicular to the axis and a plurality of electrically conductive stacked plates wherein each diode is sandwiched between each adjacent pair of said plates;
   means for applying a radially inward compressive pressure to said stack to maintain said plates and wafers in electrical contact in opposition to radially outward forces exerted on said plates and wafers while said stack is rotating around said axis; and
   electrical conductors within said housing and in electrical contact with predetermined ones of said plates and electrically isolated from predetermined others of said plates to define a rectifier circuit.

* * * * *